United States Patent
Qin et al.

(10) Patent No.: US 9,515,178 B1
(45) Date of Patent: Dec. 6, 2016

(54) SHIELDED TRENCH SEMICONDUCTOR DEVICES AND RELATED FABRICATION METHODS

(71) Applicant: FREESCALE SEMICONDUCTOR INC., Austin, TX (US)

(72) Inventors: Ganming Qin, Chandler, AZ (US); Moaniss Zitouni, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/850,486

(22) Filed: Sep. 10, 2015

(51) Int. Cl.
  *H01L 29/40* (2006.01)
  *H01L 29/78* (2006.01)
  *H01L 29/06* (2006.01)
  *H01L 29/10* (2006.01)
  *H01L 29/66* (2006.01)

(52) U.S. Cl.
  CPC ......... *H01L 29/7811* (2013.01); *H01L 29/063* (2013.01); *H01L 29/0696* (2013.01); *H01L 29/1095* (2013.01); *H01L 29/402* (2013.01); *H01L 29/407* (2013.01); *H01L 29/66712* (2013.01)

(58) Field of Classification Search
  None
  See application file for complete search history.

(56) References Cited

U.S. PATENT DOCUMENTS

| | | |
|---|---|---|
| 7,319,256 B1 | 1/2008 | Kraft et al. |
| 8,563,377 B2 | 10/2013 | Yedinak et al. |
| 8,648,412 B1 * | 2/2014 | Burke ............... H01L 29/7813 257/329 |
| 9,252,251 B2 * | 2/2016 | Hirler ............... H01L 29/0623 |
| 9,299,776 B2 * | 3/2016 | Grivna ............. H01L 21/76205 |
| 2006/0214221 A1 | 9/2006 | Challa et al. |
| 2010/0140697 A1 * | 6/2010 | Yedinak ............. H01L 29/0692 257/334 |
| 2011/0233667 A1 * | 9/2011 | Tai ..................... H01L 29/407 257/334 |
| 2014/0217495 A1 * | 8/2014 | Wutte ................ H01L 29/407 257/328 |
| 2015/0115352 A1 * | 4/2015 | Han ................... H01L 29/4236 257/330 |
| 2016/0064546 A1 * | 3/2016 | Zitouni ............. H01L 29/7811 257/334 |
| 2016/0064556 A1 * | 3/2016 | Qin ................... H01L 21/26513 257/334 |

OTHER PUBLICATIONS

Qin, G., U.S. Appl. No. 14/671,590 entitled "Trench Mosfet Shield Poly Contact," filed Mar. 27, 2015.

* cited by examiner

*Primary Examiner* — Benjamin Sandvik (57) ABSTRACT

Semiconductor device structures and related fabrication methods are provided. An exemplary semiconductor device includes gate structures within a semiconductor substrate, a shielding structure within the semiconductor substrate that includes a first portion underlying a first gate structure and a second portion proximate an end of the gate structures, and a conductive structure overlying the second portion of the shielding structure and an end region of the semiconductor substrate. The conductive structure provides an electrical connection between the second portion of the shielding structure and the end region of the semiconductor substrate residing between the gate structures proximate the end of the gate structures.

20 Claims, 6 Drawing Sheets

SHIELDED TRENCH SEMICONDUCTOR DEVICES AND RELATED FABRICATION METHODS

TECHNICAL FIELD

Embodiments of the subject matter described herein relate generally to semiconductor devices, and more particularly, to trench gate transistor devices having a shield electrode within a trench and related fabrication methods.

BACKGROUND

Vertical transistors, such as trench gate field effect transistors (FETs), frequently are utilized in high-voltage applications. Such transistors often leverage the reduced surface field (RESURF) effect to achieve a relatively low on resistance ($R_{DSon}$) while maintaining a relatively high breakdown voltage ($BV_{dss}$). RESURF-based trench gate architectures employ a one-dimensional or two-dimensional array of transistors in an epitaxial layer that overlies a substrate that itself serves as part of a drain electrode structure. Each transistor has an active region, alternatively referred to as a mesa, which is defined by a trench extending into the epitaxial layer. Well regions are formed in the mesa regions of the epitaxial layer between adjacent trenches, and a source electrode is connected to the mesa regions via a source contact region.

Conventionally, for an N-type RESURF trench transistor, the well region is provided as a P− well in which an N+ source region is formed adjacent to the sidewall of a corresponding trench. Adjacent N+ source regions for adjacent cells are isolated through the formation of a P+ region between the two N+ source regions in the P− well. The P+ region is formed through the use of an N+ mask over the region that is to become the P+ region during the implant process for the N+ source regions. It is this P+ region that acts as the channel of the vertical transistor. A dielectric layer is then formed overlying the trenches and mesas, and a contact between the N+ regions and the source electrode metallization is formed through etching of a contact opening in the dielectric layer using a source contact mask. P-type RESURF trench transistors may fabricated in a similar manner, but with regions of opposite conductivity types than those used for the N-type RESURF trench transistor.

The masks used in the formation of the semiconductor regions are subject to various photolithography design rules. The dimensions of the doped regions within mesa regions therefore are subject to the minimum size and spacing rules set forth by these photolithography design rules. The spacing between trenches (often referred to as the "silicon width" or "Sx") is a primary factor in the extent of the RESURF effect that may be achieved in a trench gate FET design. The conventional approach to trench gate FET design and its reliance on masks for formation of isolation regions and source contacts for the cells of the transistor thus limits the ability to achieve a reduced spacing between trenches and the enhanced RESURF effect that otherwise would result.

BRIEF DESCRIPTION OF THE DRAWINGS

The various embodiments will hereinafter be described in conjunction with the following drawing figures, which are not necessarily drawn to scale, wherein like numerals denote like elements, and wherein.

DETAILED DESCRIPTION

Embodiments of the subject matter described herein relate to vertical trench gate field effect transistors having an electrode structure that provides electrical shielding between the drain and the trench gates. In embodiments described herein, the shielding structure is electrically connected to the body of the transistor in a manner that eliminates the need for a separate terminal dedicated to the shield. This reduces the routing complexity associated with the device, which is particularly useful when only a single metallization layer is utilized. Additionally, reducing the amount of area allocated to routing allows for the transistor device active area to be proportionally increased, which, in turn, reduces the relative cost and on resistance.

For purposes of explanation, the subject matter may be described herein in the context of an N-type trench gate metal oxide silicon field effect transistor (MOSFET). However, it should be appreciated that the subject matter is not intended to be limited to N-type devices and may be implemented in an equivalent manner for P-type devices (e.g., by inverting doping conductivities). Similarly, the subject matter is not intended to be limited to FETs and maybe be implemented in an equivalent manner for other transistor devices, as insulated gate bipolar transistor (IGBT) devices and other types of bipolar transistors that leverage a trench gate structure. Additionally, while the subject matter may be described herein in the context of a device that includes a plurality of trench gate structures, the subject matter is not limited to any particular number of trench gate structures.

Figure 1:
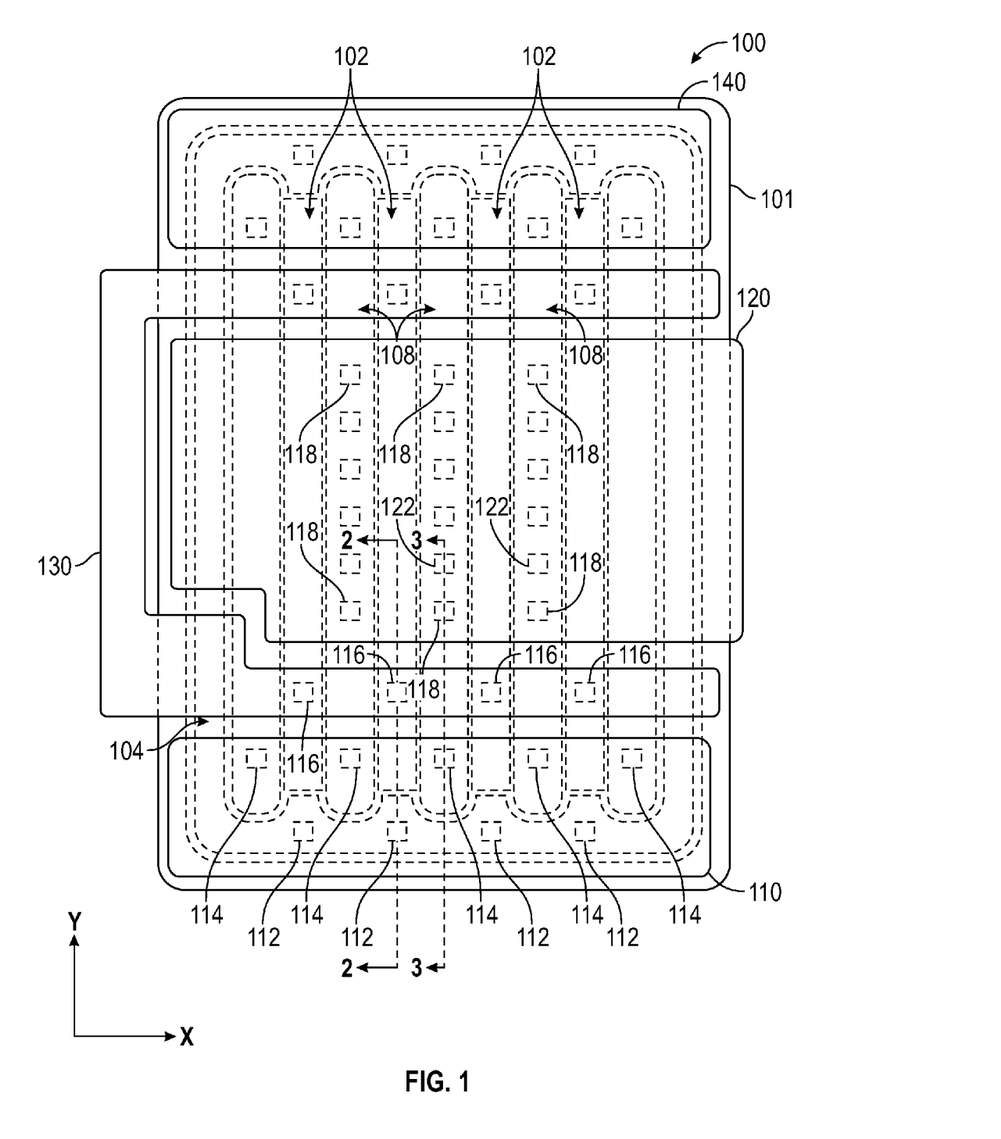
FIG. 1 is a plan view of an exemplary semiconductor device structure in accordance with one embodiment of the invention.
Figure 2:
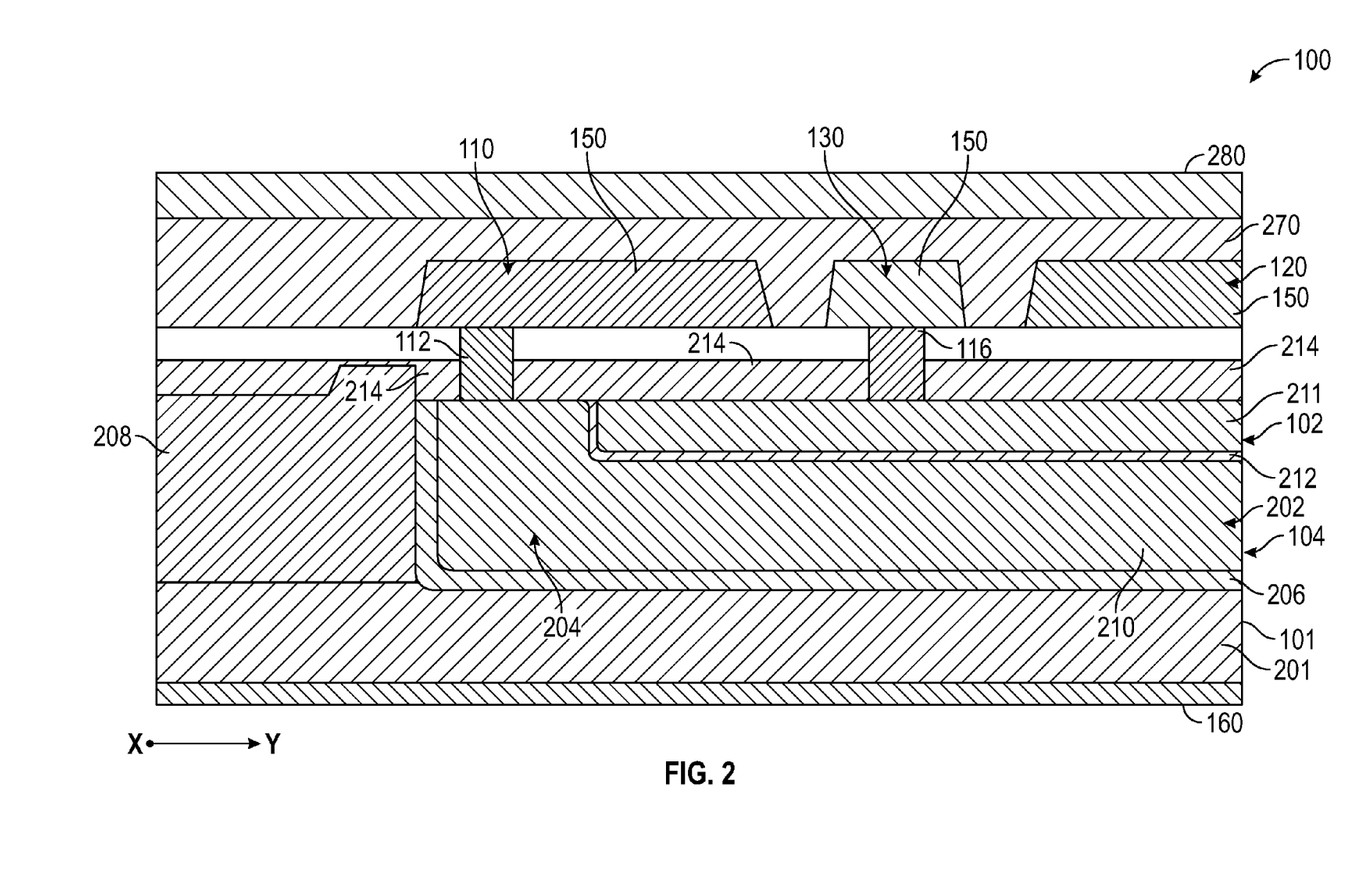
FIG. 2 depicts a cross-sectional view of the semiconductor device structure of FIG. 1 along the line 2-2 in accordance with one or more embodiments of the invention.
Figure 3:
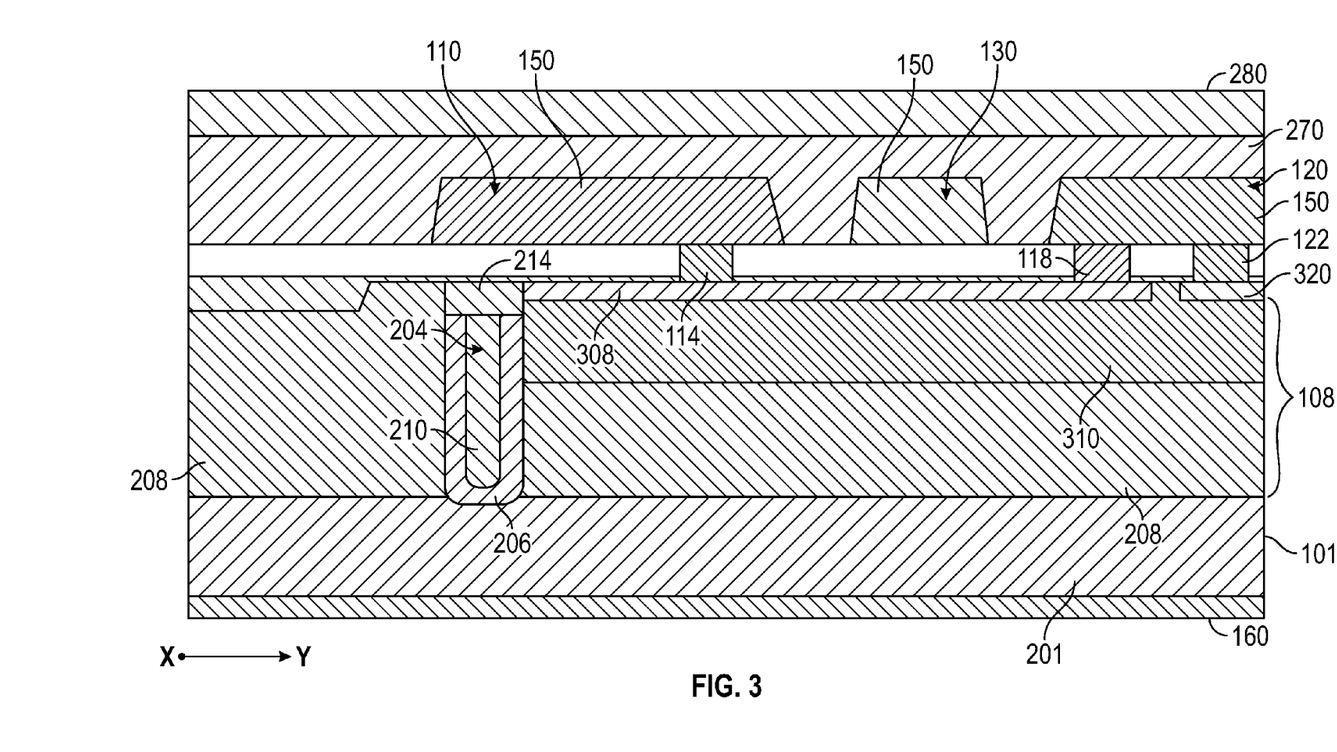
FIG. 3 depicts a cross-sectional view of the semiconductor device structure of FIG. 1 along the line 3-3 in accordance with one or more embodiments of the invention.

FIGS. 1-3 depict one exemplary embodiment of a semiconductor device structure 100 suitable for unidirectional operation. The illustrated semiconductor device 100 includes a trench gate MOSFET having a plurality of gate electrode structures 102 that are fabricated within respective trenches in a semiconductor substrate 101 and aligned substantially parallel to one another in a first direction (e.g., the y-reference direction) corresponding to the longitudinal axes of the respective gate electrode structures 102 (or the corresponding trenches). Additionally, a shielding structure 104 is fabricated within trenches in the semiconductor substrate 101 to provide an electrical shielding effect between a drain region 201 in the semiconductor substrate 101 (or the drain electrode) and the gate electrode structures 102. In this regard, the shielding structure 104 includes respective gate shielding portions 202 within the gate trenches that underlie the respective gate electrode structures 102 along the longitudinal axes of the respective gate electrode structures 102 and reside vertically between the drain region 201 and the gate electrode structures 102. The shielding structure 104 also includes termination portions 204 fabricated within a termination trench that circumscribes the plurality of gate electrode structures 102 and defines the outer perimeter of the active region of the semiconductor substrate 101 having the trench FET fabricated therein.

For purposes of explanation, the portions 204 of the shielding structure 104 disposed proximate the longitudinal ends of the gate structures 102 and aligned substantially perpendicular to the longitudinal axes of the gate structures 102 (e.g., aligned in the x-reference direction) are alternatively referred to herein as end termination portions 204, while the termination portions of the shielding structure 104 that are aligned parallel to the longitudinal axes of the gate structures 102 and extend between the longitudinal ends of the end termination portions 204 may alternatively be referred to herein as edge termination portions. In exemplary embodiments, the end termination portions 204 and edge termination portions are integral to laterally circumscribe the gate electrode structures 102 (e.g., in the xy-reference plane) and thereby laterally shield the transistor device, while the gate shielding portions 202 vertically shield the gate electrode structures 102 from the underlying drain region 201.

The multi-gate trench FET device 100 depicted in FIGS. 1-3 may be understood as including an array of cells formed in the active region of semiconductor substrate 101, where each cell includes a respective cell region 108 of the semiconductor substrate 101 (alternatively referred to as a mesa) defined by the adjacent trenches for the gate electrode structures 102 and the shielding structure 104. A conductive structure 110, such as a metal trace, overlies both the end termination portions 204 of the shielding structure 104 and the longitudinal end regions of the cell regions 108 and provides an electrical connection between the end termination portions 204 of the shielding structure 104 and the semiconductor material of the cell regions 108. To facilitate the electrical connection, shield contacts 112 overlying the end termination portions 204 of the shielding structure 104 are formed within one or more layers of dielectric material overlying the shielding structure 104 to provide a vertical electrical interconnection between the termination portions 204 and the conductive structure 110. Similarly, contacts 114 overlying the longitudinal end regions of the mesas 108 are formed proximate the end termination portions 204 to provide a vertical electrical interconnection between the mesas 108 and the conductive structure 110. In exemplary embodiments, the contacts 114 reside between the shield contacts 112 and gate contacts 116 in the longitudinal direction.

As best illustrated in FIG. 3, in exemplary embodiments, a body contact region 308 is formed in the upper surface of the mesas 108 extending inward from the longitudinal ends of the respective mesas beyond the gate contacts 116 to interior portions of the mesas 108 proximate the source contact region 320 within the respective mesa 108. Interior body contacts 118 are formed overlying the interior end portions of the body contact regions 308 within one or more overlying layers of dielectric material to provide a vertical electrical interconnection between the body contact regions 308 and another conductive structure 120 (e.g., another metal trace), which, in turn, provides lateral and longitudinal interconnections between source contacts 122 formed overlying the interior source contact regions 320 and functions as the source terminal of the semiconductor device 100. In this regard, a third conductive structure 130 providing lateral interconnections (e.g., in the x-direction) between gate contacts 116 for the gate electrode structures 102 resides longitudinally between the source conductive structure 120 and the shield conductive structure 110, with the gate contacts 116 residing between the peripheral body contacts 114 and the interior body contacts 118. By virtue of the body contact regions 308, the shielding structure 104 is electrically connected to the source contact regions 320 and the source conductive structure 120 via the contacts 112, 114, 118 and the shield conductive structure 110. Thus, the shielding structure 104 and the source contact regions 320 have substantially the same electrical potential (or voltage).

Referring primarily to FIGS. 2-3, an exemplary process for fabricating the semiconductor device 100 will now be described. The fabrication process begins by obtaining or otherwise providing a substrate 101 of doped semiconductor material having a first conductivity type. For example, for an N-type device (e.g., NMOS), the substrate 101 may be realized as a relatively heavily doped N-type semiconductor material 201 that provides an N-type drain region for the semiconductor device 100. A relatively lighter doped epitaxial layer of semiconductor material 208 having the same conductivity is grown or otherwise formed on the initial substrate material 201 to achieve a desired thickness for the substrate 101. Thereafter, upper surface of the substrate 101 is etched to form the trenches or recesses corresponding to the gate structures 102 and the shielding structure 104, which also define the cell regions 108 of the substrate 101 that are maintained intact between the trenches.

Prior to forming the portions 202, 204 of the shielding structure 104 in the trenches, a relatively thick layer of dielectric material 206 is formed on the bottoms and sidewalls of the trenches, for example, by conformably depositing a layer of silicon dioxide. Thereafter, a layer of conductive (or semiconductive) material 210 to function as the shielding structure 104 is formed in the trenches. For example, a layer of in-situ doped (e.g., N-type for a NMOS device) polysilicon material may be conformably deposited to a thickness that is greater than or equal to the depth of the trenches (e.g., a flush fill or a slight overfill), with may then be planarized to horizontally align with the upper surfaces of the portions of the semiconductor substrate 101 surrounding the trenches (e.g., the upper surface of the epitaxial layer 208). The termination portions 204 of the polysilicon material 210 are then masked while the interior portions of the polysilicon material 210 within the interior trenches are partially etched or otherwise removed to a thickness that is less than the depth of the interior trenches, resulting in the gate shielding portions 202 within the interior trenches having a thickness that is less than the thickness of the termination shielding portions 204.

After forming the shielding structure 104, a relatively thin layer of dielectric material 212 is grown or otherwise formed in the trenches overlying the polysilicon material 210 to provide electrical isolation between the shielding structure 104 and the gate structures 102. Thereafter, a layer of conductive (or semiconductive) material 211 to function as the gate structures 102 is formed in the trenches, for example, by conformably depositing a layer of in-situ doped (e.g., N-type for a NMOS device) polysilicon material. Again, in a similar manner as described above, the gate electrode material layer 211 may be formed to a thickness that is greater than or equal to the depth of the interior trenches, and then planarized back to horizontally align with the upper surfaces of the termination portions 204 of the shielding structure and the upper surfaces of the mesas 108 surrounding the gate structures 102. A reoxidation process may then performed to form a thin oxide layer (not illustrated) on the top surfaces of the trench gate structures 102, and then a conformal thick layer of silicon dioxide or other suitable dielectric material is formed overlying the substrate 101 to provide a thick top dielectric layer 214 overlying the gate structures 102, the shielding structure 104, and the mesas 108. As one example, the thin oxide layer may be formed to a thickness of approximately 0.1 micrometers (μm) or less, whereas the thicker top dielectric layer 214 may be formed to thicknesses between 0.1-2.0 μm, and preferably between 0.5 and 1.0 μm.

Referring now primarily to FIG. 3, after the gate and shield electrode structures 102, 104 are fabricated, body regions 310 of semiconductor material having a conductivity type opposite the epitaxial layer 208 are formed in the mesas 108. In exemplary embodiments, the depth of the body regions 310 relative to the surface of the substrate 101 is less than the thickness of the epitaxial layer 208 so that at least a portion of the epitaxial layer 208 is maintained intact vertically between the lower boundary of the body regions 310 and the upper surface (or boundary) of the drain region 201 to provide a relatively lighter doped N-type vertical drift region along the gate structures 102 between the higher doped drain region 201 and the overlying body and source regions 310, 320. As used herein, a "drift region" should be understood as referring to a doped region of semiconductor material between the relatively higher doped drain region and a channel region of a transistor device. The drift region supports the voltage bias at the drain region by distributing or otherwise dissipating the voltage (or electrical potential) of the drain region throughout the drift region, while also providing a conductive path for current between the channel region and the drain region.

To fabricate the body regions 310, an ion implantation mask is formed overlying the gate and shield electrode structures 102, 104 and patterned to expose the cell regions 108 of the semiconductor substrate 101, and an ion implantation process is performed to form the body regions 310 within the exposed cell regions 108. In one embodiment, a P-type high voltage (PHV) implant process may be performed by implanting P-type ions, such as boron, at a dopant concentration of about $1 \times 10^{13}/cm^2$ to about $2 \times 10^{13}/cm^2$ at an energy level in the range of about 100 kiloelectron volts (keV) to about 300 keV so that the depth of the body regions 310 (after subsequent thermal annealing or any other diffusion) is in the range of about 1 μm to about 2 μm.

After forming the body regions 310, the source regions 320 are formed within the body regions 310 by forming an ion implantation mask overlying the portions of the mesas 108 to be utilized for the body contact regions 308 and implanting ions having the opposite conductivity to the body regions 310 into the exposed interior portions of the body regions 310 adjacent to the gate structures 102. For example, N-type source regions 320 may be formed by implanting N-type ions, such as arsenic, having a dopant concentration in the range of about $6 \times 10^{15}/cm^2$ and an energy level in the range of about 50 keV to about 100 keV to provide a depth (after diffusion) that is less than a depth of the body regions 310, and typically, about 0.5 microns or less. In one or more embodiments, the source regions 320 extend (e.g., in the x-direction) between the sidewalls of the adjacent trenches that define the respective mesa region 108 in which the respective source contact region 320 is formed.

Similarly, the body contact regions 308 are formed within the body regions 310 by forming an ion implantation mask overlying the source regions 320 and the gate and shield electrode structures 102, 104 and implanting ions having the same conductivity as the body regions 310 into the exposed portions of the body regions 310 adjacent to the termination portions 202 of the shielding structure 104 at the longitudinal ends of the gate structures 102. For example, P-type body contact regions 308 may be formed by implanting P-type ions having a dopant concentration of about $1.5 \times 10^{15}/cm^2$ and an energy level in the range of about 50 keV to about 100 keV to provide a depth (after diffusion) that is less than a depth of the body regions 310, and typically, about 0.5 microns or less. As best illustrated in FIG. 3, the body contact regions 308 extend along the longitudinal axes of the gate structures 102 (e.g., in the y-direction) from the ends adjacent to the termination portions 204 of the shielding structure 104 and underneath finger portions of the subsequently formed gate electrode terminal 130 (which extends perpendicular to the gate structures 102 in the x-direction), until reaching an interior location underlying the subsequently formed source electrode terminal 120. Furthermore, in some embodiments, the interior boundaries of the body contact regions 308 may contact or otherwise abut the source contact regions 320. Similarly, outer boundaries of the body contact regions 308 may contact or otherwise abut dielectric material at the longitudinal ends of the mesas 108, such as the dielectric layer 214 overlying the end termination portions 204 or the dielectric material 206 that isolates the body contact regions 308 from the end termination portions 204. In one or more embodiments, the body contact regions 308 also extend (e.g., in the x-direction) between the sidewalls of the adjacent trenches that define the respective mesa region 108 in which the respective body contact region 308 is formed.

Still referring to FIGS. 1-3, fabrication of the illustrated semiconductor device 100 is completed by forming the contacts 112, 114, 116, 118, 122 (or plugs) within the relatively thick top dielectric layer 214, for example, by etching the dielectric layer 214 (and any overlying layers of dielectric material) at the desired locations, depositing or otherwise filling the resulting voids with a conductive contact material (e.g., tungsten) and planarizing or otherwise removing any excess contact material. The contacts 112, 114, 116, 118, 122 provide vertical electrical interconnections to/from the transistors fabricated on the substrate 101. Thereafter, lateral electrical interconnections among the contacts 112, 114, 116, 118, 122 are formed in an overlying metallization layer. For example, a layer of metal material 150 (or another conductive material) may be deposited or otherwise formed on the upper surface of the substrate 101 to a desired thickness and then patterned or etched to provide the desired conductive structures 110, 120, 130, 140 for establishing electrical connections to the transistors on the substrate 101. Another metal layer 160 may be fabricated on a bottom surface of the substrate 101 and in direct contact with the drain region 201 to provide a drain electrode terminal for the semiconductor device 100.

Conductive structures 110, 140 function as shield electrode terminals (or alternatively, body electrode terminals) that provide lateral electrical interconnections between the shield contacts 112 and the body contacts 114. As illustrated, by virtue of contacts 118 providing an electrical connection to the voltage of the source terminal 120, the shield electrode terminals 110, 140 may terminate at or near the edges or ends of the respective trenches that include the termination portions 204, such that the terminals 110, 140 do not extend beyond the perimeter of the region of the substrate 101 allocated to the semiconductor device 100. Additionally, the gate terminal 130 and source terminal 120 may be designed, patterned, or otherwise configured without being concerned with accommodating more complex routing for the shield terminals 110, 140, thereby reducing any sort of area penalty that would otherwise be associated with providing the electrical connection between the source terminal 120 and the shield terminals 110, 140 via routing at the metal layer 150.

In exemplary embodiments where a single metallization layer 150 is utilized, after patterning the upper device terminals 110, 120, 130, 140, one or more layers of passivation material 270 (e.g., a nitride material, an oxide material, another suitable dielectric material or a combination of dielectric materials) may be formed overlying the substrate 101, and thereafter, one or more layers of polyimide material 280 may be fabricated overlying the passivation layer 270. One or more additional back-end-of-line (BEOL) fabrication process may be performed next, such as cutting or dicing the substrate 101, resulting in the diced semiconductor die that corresponds to the active area of the semiconductor device 100 depicted in FIG. 1. It should be noted that the source and gate electrode structures 120, 130 may function as bonding areas for the semiconductor device 100 while the shield electrode structures 110, 140 do not extend beyond the perimeter of the diced semiconductor substrate 101 and merely function as interconnects between shield and body contacts 112, 114.

Still referring to FIGS. 1-3, it is noted that in some embodiments, the spacing between the mesas and the spacing between the mesas and an outer perimeter of a recess forming the mesas may be substantially the same, with the shielding structure 104 within the trench extending from the region between the mesas to the region between the ends of the mesas and the outer perimeter of the recess forming the mesas. In such embodiments, a perimeter of a shield contact 112 residing between the shield electrode terminal 110, 140 and the end termination portions 204 may include a point that is smallest equidistant from two corresponding mesas, and a lateral distance of an outer perimeter of the recess. In order to facilitate the etch process that defines the mesas and outer perimeter of a contiguous trench, a distance between mesa pairs, and between each mesa and the outside perimeter of the trench, may be selected to be substantially the same. That said, in other embodiments, the trenches for the gate electrode structures 102 and the termination portions 204 of the shielding structure 104 may be realized as separate, non-contiguous trenches. Additionally, edge termination mesas between (e.g., in the x-direction) the edge termination portions of the shielding structure 104 and the peripheral gate structures 102 may provide an edge termination structure that is different from the mesas 108 residing between gate structures 102. For example, edge termination mesas may include a body region having a shallower depth than the body regions 310 of the active device mesas 108, and the edge termination mesas may not include source contact regions (as indicated by the absence of source contacts 122 in FIG. 1).

Figure 4:
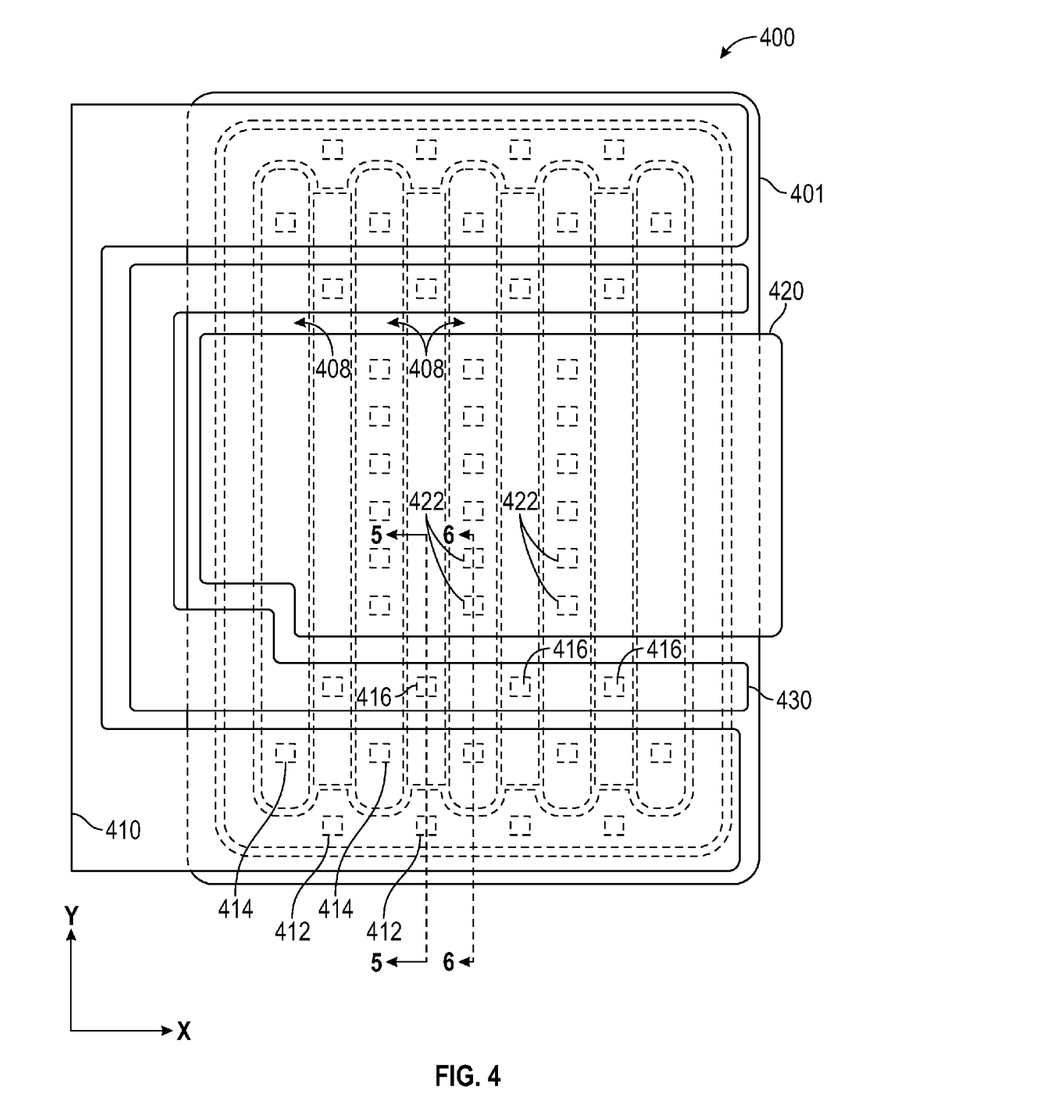
FIG. 4 is a plan view of an exemplary semiconductor device structure in accordance with another embodiment of the invention.
Figure 5:
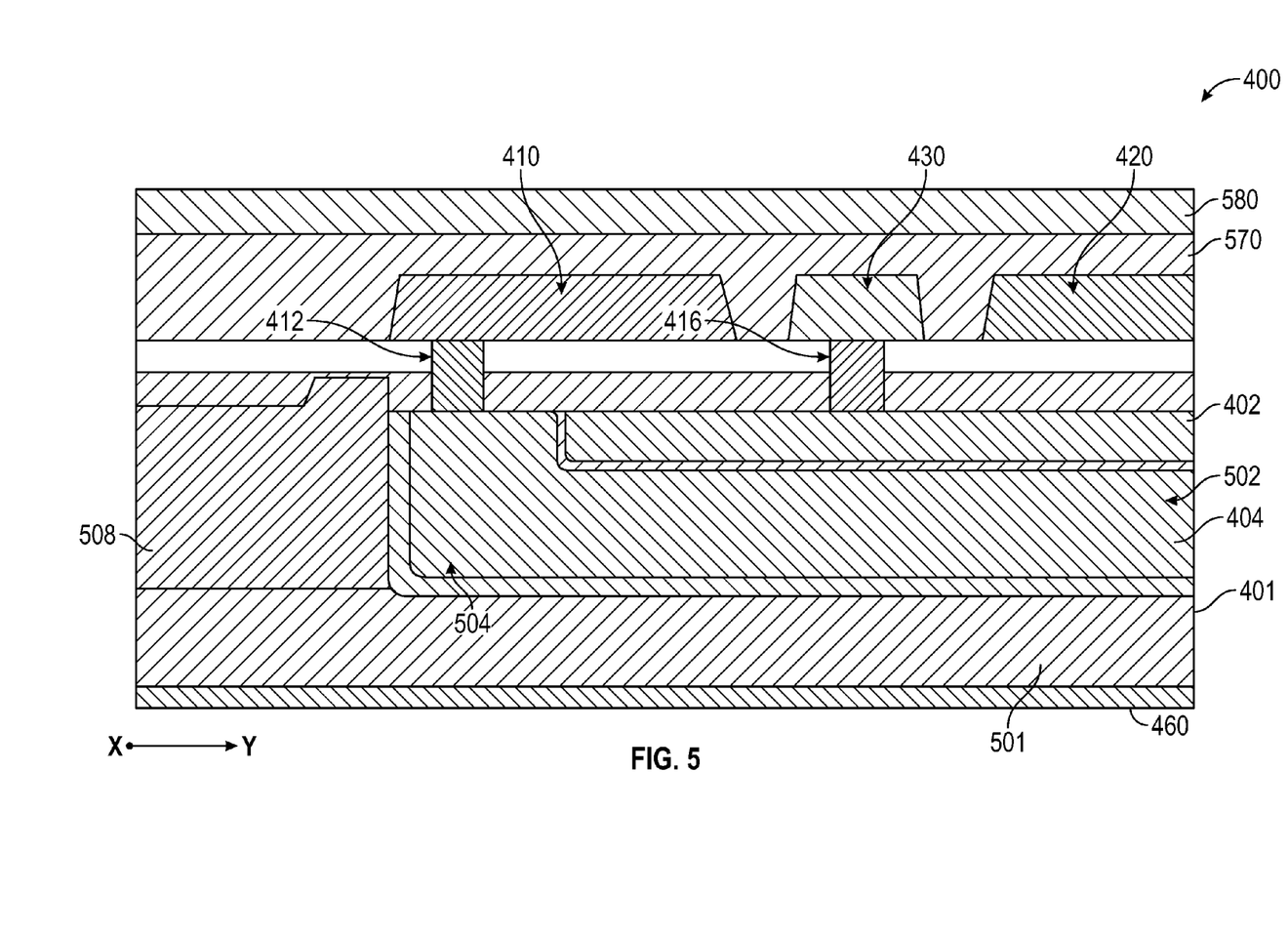
FIG. 5 depicts a cross-sectional view of the semiconductor device structure of FIG. 4 along the line 5-5 in accordance with one or more embodiments of the invention.
Figure 6:
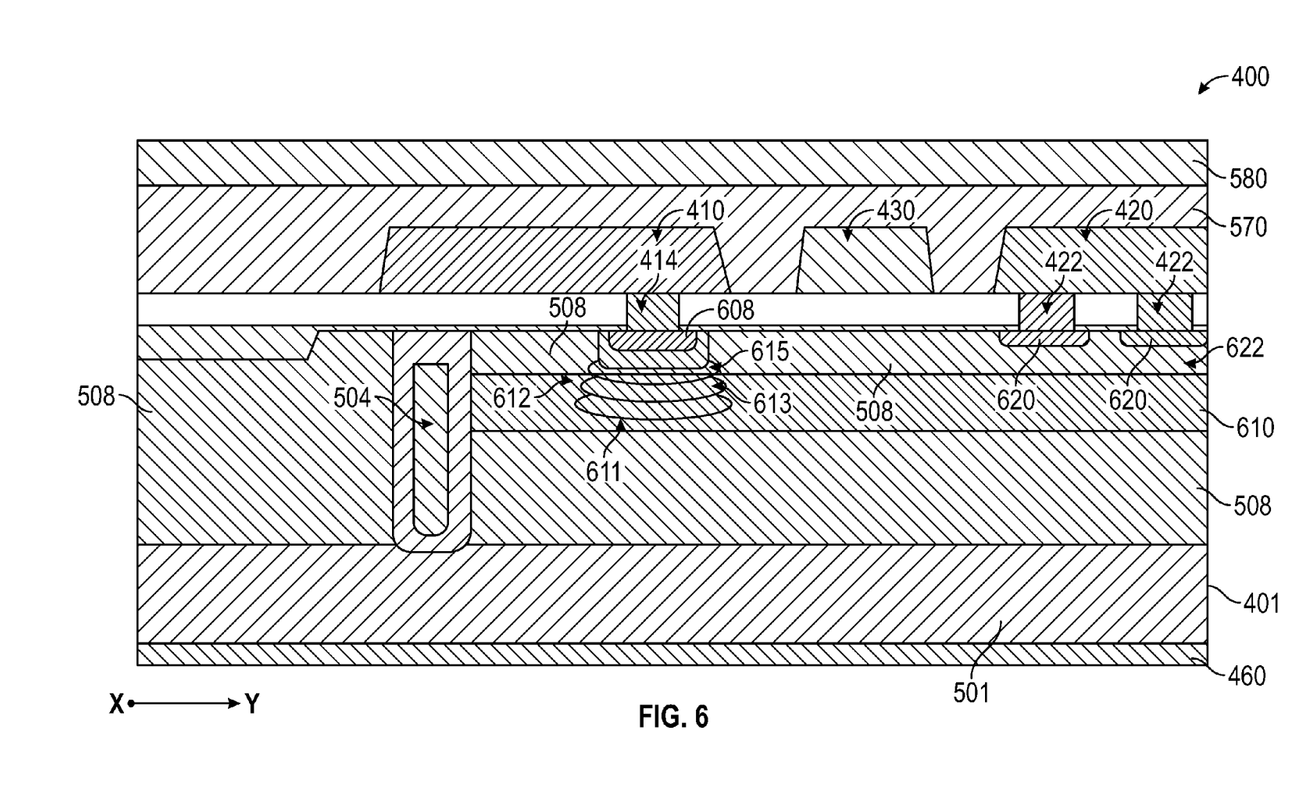
FIG. 6 depicts a cross-sectional view of the semiconductor device structure of FIG. 4 along the line 6-6 in accordance with one or more embodiments of the invention.

FIGS. 4-6 depict another exemplary embodiment of a semiconductor device structure 400 suitable for bidirectional operation. In a similar manner as described above in the context of FIGS. 1-3, the bidirectional semiconductor device 400 includes a plurality of trench gate electrode structures 402 fabricated within respective trenches in a semiconductor substrate 401 and having longitudinal axes aligned substantially parallel to one another. A shielding structure 404 is also fabricated within trenches in the semiconductor substrate 401 that includes gate shielding portions 502 underlying the respective gate electrode structures 402 within the gate trenches and end termination portions 504 fabricated within a termination trench that circumscribes the gate electrode structures 402 and defines the outer perimeter of the active region of the semiconductor substrate 401. A contiguous conductive structure 410 functioning as the body electrode terminal overlies the end termination portions 504 of the shielding structure 404 at both longitudinal ends of the gate structures 102 and the longitudinal ends of the cell regions 408 of the substrate 401 and provides an electrical connection between the end termination portions 504 of the shielding structure 404 and the body regions 610 of the transistors.

As best illustrated in FIG. 6, the semiconductor device 400 includes buried body regions 610 between the gate structures 402 that extend along the longitudinal axis of the cell regions 408. The body region 610 is buried in that its upper boundary has a non-zero depth below the upper surface of the semiconductor substrate 401 (or alternatively, the upper surface of the epitaxial layer 508), so that a region of semiconductor material 508 having a different dopant conductivity resides above at least a portion of the buried body region 610. In exemplary embodiments, the depth of the upper boundary of the buried region 610 is greater than the depth of the lower boundaries of the body and source contact regions 608, 620 formed in the substrate 401, so that the lower boundaries of the source contact regions 620 are separated from the upper boundary of the buried body region 610 by a region 622 of the epitaxial layer 508 having the same conductivity as the source contact regions 620. In this regard, the intervening epitaxial region 622 functions as a second drift region in the reverse operational mode (e.g., when the source potential is greater than the drain potential). The body contact regions 608 are formed at or near the longitudinal ends of the cell regions 408 underlying at least a portion of the body electrode terminal 410, and the body contact regions 608 are conductively connected to the body electrode terminal 410 via body contacts 414. Each body contact region 608 is electrically connected to the buried body region 610 via a doped body link region 612 having the same conductivity type that is formed vertically between the buried body region 610 and the body contact region 608, thereby electrically connecting the buried body region 610 to the body electrode terminal 410 via the overlying body link region 612, body contact region 608, and body contact 414. The body link region 612 may be realized as a plurality of subregions formed using a chained ion implant process, whereby a series of ion implant processes at different implant energies is performed to form a chain of overlapping doped regions that extend from the body contact region 608 to the buried body region 610.

Referring primarily to FIGS. 5-6, an exemplary process for fabricating the semiconductor device 400 will now be described. It should be noted that various fabrication process steps may be similar or identical to corresponding fabrication process steps described above in the context of FIGS. 1-3, and such common aspects will not be redundantly described here in the context of FIGS. 4-6. As described above, for an N-type device, a relatively lighter doped N-type epitaxial layer 508 of semiconductor material is grown or otherwise formed on a relatively heavily doped N-type substrate semiconductor material that provides the N-type drain region 501 of the semiconductor device 400. Thereafter, substrate 401 is etched to form the trenches or recesses corresponding to the gate structures 402 and the shielding structure 404, which are then filled with a polysilicon material or another suitable material to provide the gate structures 402 and the shielding structure 404.

After forming the gate and shielding electrode structures 402, 404, the body link region 612 is formed by masking the substrate 401 with an ion implantation mask that is patterned to expose portions of the cell regions 408 at or near the longitudinal ends of the cell regions 408 that correspond to the subsequently formed body contact regions 608 and then performing one or more ion implantation processes. For example, a chained ion implant process may provide a series of ion implants at different implant energies, resulting in a chain of overlapping doped regions that will extend from the upper surface of the epitaxial layer 508 to the upper boundary of the body regions 610. For example, a first implantation of P-type ions at a dopant concentration of about $2\times10^{14}/cm^2$ at an energy level of about 320 keV to form a lower doped region 611 having a depth (after annealing and any other diffusion) that will overlap, abut, or otherwise contact at least a portion of the buried body region 610, followed by a second implantation of P-type ions at a dopant concentration of about $2\times10^{14}/cm^2$ at an energy level of about 80 keV to form an upper doped region 613 having a depth (after annealing and any other diffusion) that will overlap, abut, or otherwise contact at least an upper portion of the lower doped region 611 and also overlap, abut, or otherwise contact at least a lower portion of the body contact region 608. That said, any number of ion implants may be performed in a desired sequence of implant energy levels and dopant concentrations to achieve a desired body link region 612.

Thereafter, the body link implantation mask may be removed, and the buried body regions 610 of semiconductor material having the same conductivity are formed by masking the gate and shield electrode structures 402, 404 and performing a blanket ion implantation process across the exposed cell regions 408 to form the body regions 610 within the exposed epitaxial layer 508. In one embodiment, a P-type high voltage (PHV) implant process may be performed by implanting P-type ions, such as boron, at a dopant concentration of about $1\times10^{13}/cm^2$ to about $2\times10^{13}/cm^2$ at an energy level in the range of about 750 kiloelectron volts (keV) to about 1100 keV so that the depth of the body regions 310 (after subsequent thermal annealing or any other diffusion) is in the range of about 1 μm to about 3 μm. In a similar manner as described above, the depth of the lower boundary of the body regions 610 relative to the upper surface of the epitaxial layer 508 is less than the thickness of the epitaxial layer 508 so that at least a portion of the epitaxial layer 508 is maintained intact vertically between the lower boundary of the body regions 610 and the upper boundary of the drain region 501 to provide a relatively lighter doped N-type vertical drift region between the higher doped drain region 501 and the overlying body and source regions 410, 420. The depth of the upper boundary of the body regions 610 relative to the upper surface of the epitaxial layer 508 is greater than the depth of the subsequently formed body and source contact regions 608, 620 (but less than the cumulative depth of the body link regions 612) so that at least a portion 622 of the epitaxial layer 508 is maintained intact vertically between the upper boundary of the body regions 610 and the lower boundary of the source contact regions 620. This intervening portion 622 functions as a drift region in the reverse operational mode when the potential at the source 420, 620 is greater than the potential of the drain 460, 501.

After forming the body regions 610, the source regions 620 are formed within the epitaxial layer 508 by forming implanting ions having the same conductivity as the epitaxial layer 508 with a dopant concentration that is greater than the dopant concentration of the epitaxial layer 508 and the body regions 610 using an appropriately patterned implantation mask. For example, N-type source regions 620 may be formed by implanting N-type ions, such as arsenic, having a dopant concentration in the range of about $6\times10^{15}/cm^2$ and an energy level in the range of about 50 keV to about 100 keV to provide a depth (after diffusion) that is less than a depth of the body regions 610, and typically, about 0.5 microns or less. The body contact regions 608 are formed within the body link regions 612 by forming an ion implantation mask that exposes the body link regions 612 and implanting ions having the same conductivity as the body regions 610 and body link regions 612. For example, P-type body contact regions 308 may be formed by implanting P-type ions having a dopant concentration in the range of about $1.5\times10^{15}/cm^2$ and an energy level in the range of about 50 keV to about 100 keV to provide a depth (after diffusion) that is less than a depth of the body regions 310, and typically, about 0.5 microns or less.

Fabrication of the illustrated semiconductor device 400 is completed by forming the contacts 412, 414, 416, 418, 422 (or plugs) that provide vertical electrical interconnections to/from the substrate 401, and thereafter, forming a layer of metal material 450 (or another conductive material) overlying the substrate 401 that is patterned or etched to provide the desired lateral electrical interconnections among the contacts 412, 414, 416, 418, 422, while another metal layer 460 is fabricated on a bottom surface of the substrate 401 and in direct contact with the drain region 501 to provide a drain electrode terminal for the semiconductor device 400. In a single metal layer embodiment, one or more passivation layers 570 followed by one or more polyimide layers 580 may be formed overlying the single metal layer 460 before dicing and other BEOL fabrication process steps.

In the embodiment of FIGS. 4-6, body electrode terminal 410 connects the shielding structure 404 to the body voltage (or electrical potential), thereby eliminating the need for an additional shield electrode terminal and related routing. Thus, the body, source and gate terminals 410, 420, 430 may be designed, patterned, or otherwise configured without being concerned with accommodating more complex routing for the shield terminal(s).

For the sake of brevity, conventional techniques related to semiconductor and/or integrated circuit fabrication, photolithography, minimum spacing requirements and other routing or layout constraints, and other functional aspects of the subject matter may not be described in detail herein. In addition, certain terminology may be used herein for the purpose of reference only, and thus are not intended to be limiting. For example, the terms "first", "second" and other such numerical terms referring to structures do not imply a sequence or order unless clearly indicated by the context. The foregoing description also refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although a schematic shown in the figures may depict direct electrical connections between circuit elements and/or terminals, alternative embodiments may employ intervening circuit elements and/or components while functioning in a substantially similar manner.

In conclusion, devices and methods configured in accordance with example embodiments of the invention relate to:

An apparatus for a semiconductor device is provided in one embodiment. The semiconductor device comprises a plurality of gate structures within a semiconductor substrate and aligned in a first direction, a shielding structure within the semiconductor substrate that includes a first portion underlying a first gate structure of the plurality of gate structures and a second portion proximate an end of the plurality of gate structures, and a conductive structure overlying the second portion of the shielding structure and an end region of the semiconductor substrate residing between the plurality of gate structures proximate the end of the plurality of gate structures. The conductive structure provides an electrical connection between the second portion and the end region. In one embodiment, the semiconductor device further comprises a first contact region in the end region of the semiconductor substrate, wherein the conductive structure provides the electrical connection between the first contact region and the second portion of the shielding structure. The semiconductor device further comprises a second conductive structure overlying the first contact region and a source contact region in the semiconductor substrate, wherein the second conductive structure provides a second electrical connection between the first contact region and the source contact region. In one embodiment, the first contact region and the source contact region have opposite conductivities. In another embodiment, the first contact region resides between the source contact region and the second portion in the first direction. In yet another embodiment, the semiconductor device further comprises a third conductive structure having at least a third portion residing between the conductive structure and the second conductive structure, wherein the third conductive structure provides a third electrical connection between the plurality of gate structures. In another embodiment, the semiconductor device further comprises a body region of semiconductor material having a first conductivity type within the semiconductor substrate, wherein the first contact region abuts the body region and has the first conductivity type and the source contact region abuts the body region and has a second conductivity type opposite the first conductivity type.

In one embodiment, the semiconductor device comprises a buried body region within the semiconductor substrate, wherein the first contact region and the conductive structure provide the electrical connection between the buried body region and the second portion of the shielding structure. The semiconductor device further comprises a link region between the buried body region and the first contact region, with the link region having the same conductivity type as the buried body region and the first contact region to provide a second electrical connection between the buried body region and the first contact region. In one embodiment, the link region abuts the first contact region and the buried body region. In another embodiment, the first portion and the second portion of the shielding structure are integral. In yet another embodiment, the plurality of gate structures are insulated from the shielding structure. In another embodiment, the conductive structure does not extend beyond a perimeter of a diced portion of the semiconductor substrate, and the diced portion includes the plurality of gate structures and the shielding structure formed therein.

An apparatus for a vertical transistor device is provided. The vertical transistor device comprises a drain region of semiconductor material having a first conductivity type within a semiconductor substrate, a plurality of trench gate structures within the semiconductor substrate overlying the drain region and having longitudinal axes aligned in a first direction, a shielding structure within the semiconductor substrate and insulated from the plurality of trench gate structures, and a conductive structure. The shielding structure includes gate shielding portions residing vertically between respective trench gate structures of the plurality of trench gate structures and the drain region and a termination portion orthogonal to the longitudinal axes of the plurality of trench gate structures proximate a longitudinal end of the plurality of trench gate structures. The conductive structure overlies the termination portion and end regions of the semiconductor substrate residing between the plurality of trench gate structures proximate the longitudinal end of the plurality of trench gate structures, wherein the conductive structure is electrically connected to the termination portion and the end regions. One embodiment of the vertical transistor device further comprises body contact regions within the end regions of the semiconductor substrate, wherein the conductive structure provides an electrical connection between the body contact regions and the termination portion of the shielding structure. In another embodiment, the vertical transistor device further comprises a second conductive structure overlying interior portions of the body contact regions and source contact regions in the semiconductor substrate between the plurality of trench gate structures, wherein the second conductive structure provides a second electrical connection between the body contact regions and the source contact regions. In one embodiment, the vertical transistor device further comprises a third conductive structure having at least a first portion residing between the conductive structure and the second conductive structure, wherein the third conductive structure provides a third electrical connection between the plurality of trench gate structures.

In another embodiment, a method of fabricating a semiconductor device on a substrate of semiconductor material is provided. The method comprises forming a shielding structure comprising a plurality of gate shielding portions aligned in a first direction and a termination portion proximate an end of the plurality of gate shielding portions within the substrate, forming a plurality of gate structures aligned in the first direction within the substrate overlying the plurality of gate shielding portions, forming a body contact region in an end region of the substrate residing between the plurality of gate structures proximate the termination portion of the shielding structure, and forming a conductive structure overlying the termination portion of the shielding structure and the body contact region, wherein the conductive structure provides an electrical connection between the termination portion and the body contact region. In one embodiment, the method further comprises forming a source contact region in an interior region of the substrate residing between the plurality of gate structures, wherein the body contact region extends from the end region towards the interior region, and forming a second conductive structure overlying an interior portion of the body contact region and the source contact region, wherein the second conductive structure provides a second electrical connection between the body contact region and the source contact region. In another embodiment, the method further comprises forming a buried body region having a first conductivity type in the substrate between the plurality of gate structures and forming a link region having the first conductivity type in the end region of the substrate overlying and abutting the buried body region, wherein forming the body contact region comprises forming the body contact region having the first conductivity type abutting the link region, and the conductive structure provides the electrical connection between the buried body region and the termination portion via the body contact region and the link region.

The foregoing detailed description is merely illustrative in nature and is not intended to limit the embodiments of the subject matter or the application and uses of such embodiments. Any implementation described herein as exemplary is not necessarily to be construed as preferred or advantageous over other implementations. Additionally, there is no intention to be bound by any expressed or implied theory presented in the preceding technical field, background, or the detailed description.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. A semiconductor device comprising:
   a plurality of gate structures within a semiconductor substrate, the plurality of gate structures being aligned in a first direction;
   a shielding structure within the semiconductor substrate, the shielding structure including a first portion underlying a first gate structure of the plurality of gate structures and a second portion proximate a longitudinal end of the plurality of gate structures;
   a body contact region in the semiconductor substrate residing between the plurality of gate structures and extending from the longitudinal end toward an interior portion of the semiconductor substrate;
   a conductive structure overlying the second portion of the shielding structure and a longitudinal end region of the body contact region of the semiconductor substrate residing between the plurality of gate structures proximate the longitudinal end of the plurality of gate structures, wherein the conductive structure provides an electrical connection between the second portion and the longitudinal end region of the body contact region; and
   a source conductive structure overlying an interior end portion of the body contact region, wherein the interior end portion of the body contact region is electrically connected to the source conductive structure.

2. The semiconductor device of claim 1, further comprising a source contact region in the semiconductor substrate, wherein the source conductive structure provides a second electrical connection between the interior end portion of the body contact region and the source contact region.

3. The semiconductor device of claim 2, wherein the body contact region resides between the source contact region and the second portion of the shielding structure.

4. The semiconductor device of claim 3, further comprising a third conductive structure having at least a third portion residing between the conductive structure and the source conductive structure, wherein the third conductive structure provides a third electrical connection between the plurality of gate structures.

5. The semiconductor device of claim 4, wherein the conductive structure does not extend beyond a perimeter of a diced portion of the semiconductor substrate, the diced portion including the plurality of gate structures, the shielding structure, the body contact region, and the source contact region formed therein.

6. The semiconductor device of claim 2, wherein the body contact region and the source contact region have opposite conductivities.

7. The semiconductor device of claim 2, wherein the body contact region resides between the source contact region and the second portion in the first direction.

8. The semiconductor device of claim 2, further comprising a third conductive structure having at least a third portion residing between the conductive structure and the source conductive structure, wherein the third conductive structure provides a third electrical connection between the plurality of gate structures.

9. The semiconductor device of claim 2, further comprising a body region of semiconductor material having a first conductivity type within the semiconductor substrate, wherein:
   the body contact region abuts the body region and has the first conductivity type; and
   the source contact region abuts the body region and has a second conductivity type opposite the first conductivity type.

10. The semiconductor device of claim 1, further comprising a buried body region within the semiconductor substrate, wherein the body contact region and the conductive structure provide the electrical connection between the buried body region and the second portion of the shielding structure.

11. The semiconductor device of claim 10, further comprising a link region between the buried body region and the body contact region, the link region having the same conductivity type as the buried body region and the body contact region to provide a second electrical connection between the buried body region and the body contact region.

12. The semiconductor device of claim 11, wherein the link region abuts the body contact region and the buried body region.

13. The semiconductor device of claim 1, wherein the first portion and the second portion of the shielding structure are integral.

14. The semiconductor device of claim 1, wherein the plurality of gate structures are insulated from the shielding structure.

15. The semiconductor device of claim 1, wherein the conductive structure does not extend beyond a perimeter of a diced portion of the semiconductor substrate, the diced portion including the plurality of gate structures and the shielding structure formed therein.

16. A vertical transistor device comprising:
   a drain region of semiconductor material having a first conductivity type within a semiconductor substrate;
   a plurality of trench gate structures within the semiconductor substrate overlying the drain region and having longitudinal axes aligned in a first direction;
   a shielding structure within the semiconductor substrate and insulated from the plurality of trench gate structures, the shielding structure including:

gate shielding portions residing vertically between respective trench gate structures of the plurality of trench gate structures and the drain region; and a termination portion orthogonal to the longitudinal axes of the plurality of trench gate structures proximate a longitudinal end of the plurality of trench gate structures;

body contact regions within the end regions of the semiconductor substrate and extending from the longitudinal end to an interior portion of the semiconductor substrate;

source contact regions within the interior portion of the semiconductor substrate;

a conductive structure overlying the termination portion and longitudinal end regions of the body contact regions of the semiconductor substrate residing between the plurality of trench gate structures proximate the longitudinal end of the plurality of trench gate structures, wherein the conductive structure is electrically connected to the termination portion and the longitudinal end regions of the body contact regions; and a second conductive structure overlying interior portions of the body contact regions and source contact regions in the semiconductor substrate between the plurality of trench gate structures, wherein the second conductive structure provides a second electrical connection between the interior portions of the body contact regions and the source contact regions.

17. The vertical transistor device of claim 16, further comprising a third conductive structure having at least a first portion residing between the conductive structure and the second conductive structure, wherein the third conductive structure provides a third electrical connection between the plurality of trench gate structures.

18. A method of fabricating a semiconductor device on a substrate of semiconductor material, the method comprising:

forming a shielding structure within the substrate, the shielding structure comprising a plurality of gate shielding portions aligned in a first direction and a termination portion proximate an end of the plurality of gate shielding portions;

forming a plurality of gate structures aligned in the first direction within the substrate overlying the plurality of gate shielding portions;

forming a body contact region in an end region of the substrate, the end region residing between the plurality of gate structures proximate the termination portion of the shielding structure and extending from a longitudinal end toward an interior region of the substrate;

forming a conductive structure overlying the termination portion of the shielding structure and the longitudinal end of the body contact region, wherein the conductive structure provides an electrical connection between the termination portion and the longitudinal end of the body contact region; and forming a source conductive structure overlying an interior end portion of the body contact region, wherein the interior end portion of the body contact region is electrically connected to the source conductive structure.

19. The method of claim 18, further comprising:

forming a source contact region in the interior region of the substrate residing between the plurality of gate structures, wherein the second conductive structure overlies the source contact region and provides a second electrical connection between the body contact region and the source contact region.

20. The method of claim 18, further comprising:

forming a buried body region having a first conductivity type in the substrate between the plurality of gate structures; and forming a link region having the first conductivity type in the end region of the substrate overlying and abutting the buried body region, wherein:

forming the body contact region comprises forming the body contact region having the first conductivity type abutting the link region; and the conductive structure provides the electrical connection between the buried body region and the termination portion via the body contact region and the link region.

* * * * *